(12) United States Patent
Ohsawa (10) Patent No.: US 7,244,991 B2
(45) Date of Patent: Jul. 17, 2007

(54) SEMICONDUCTOR INTEGRATED DEVICE

(75) Inventor: Takashi Ohsawa, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 11/092,920

(22) Filed: Mar. 30, 2005

(65) Prior Publication Data

US 2006/0046408 A1    Mar. 2, 2006

(30) Foreign Application Priority Data

Aug. 31, 2004 (JP) ............................. 2004-252757

(51) Int. Cl.
*H01L 27/01* (2006.01)
*H01L 27/12* (2006.01)
*H01L 31/0392* (2006.01)

(52) U.S. Cl. .................. 257/347; 257/197; 257/288; 257/E21.051; 257/E21.32; 257/E21.545

(58) Field of Classification Search ................ 257/347, 257/192, 197, 213, 350, 401, 900, 288
See application file for complete search history.

(56) References Cited

U.S. PATENT DOCUMENTS

| | | | |
|---|---|---|---|
| 5,789,790 A * | 8/1998 | Morishita et al. ........... | 257/378 |
| 6,365,932 B1 * | 4/2002 | Kouno et al. ................ | 257/341 |
| 6,465,316 B2 * | 10/2002 | Hattori et al. .............. | 438/311 |
| 6,538,916 B2 | 3/2003 | Ohsawa ....................... | 257/347 |
| 6,593,627 B2 * | 7/2003 | Egashira ..................... | 257/350 |
| 6,903,419 B2 * | 6/2005 | Ohsawa ....................... | 257/347 |
| 7,023,054 B2 * | 4/2006 | Ohsawa ....................... | 257/369 |

* cited by examiner

*Primary Examiner*—David Nhu
(74) *Attorney, Agent, or Firm*—Oblon, Spivak, McClelland, Maier & Neustadt, P.C.

(57) ABSTRACT

A semiconductor integrated apparatus, including: an SOI (Silicon On Insulator) substrate which has a support substrate and an embedded insulation film; an NMOSFET, a PMOSFET and an FBC (Floating Body Cell) formed on the SOI substrate separately from each other; a p type of first well diffusion region formed along the embedded insulation film in the support substrate below the NMOSFET; an n type of second well diffusion region formed along the embedded insulation film in the support substrate below the PMOSFET; and a conduction type of third well diffusion region formed along the embedded insulation film in the support substrate below the FBC.

14 Claims, 11 Drawing Sheets

SEMICONDUCTOR INTEGRATED DEVICE

CROSS REFERENCE TO RELATED APPLICATIONS

This application is based upon and claims the benefit of priority from the prior Japanese Patent Application No. 2004-252757, filed on Aug. 31, 2004, the entire contents of which are incorporated herein by reference.

BACKGROUND OF THE INVENTION

1. Field of the Invention

The present invention relates to a semiconductor integrated device including well diffused regions formed in a SOI (Silicon on Insulator) substrate.

2. Related Art

As for the conventional DRAM cell consisted of one transistor and one capacitor including a trench capacitor or a stacked capacitor, there is a concern that its fabrication may become difficult as it becomes finer. As a candidate for a future DRAM cell, a new memory cell FBC (Floating Body Cell) is proposed (see Japanese Patent Application Laid-Open Nos. 2003-68877 and 2002-246571). In the FBC, majority carriers are stored in a floating body of an FET (Field Effect Transistor) formed on SOI (Silicon on Insulator) or the like, to store information.

In such an FBC, an element unit for storing one bit information is formed of only one MISFET (Metal Insulator Semiconductor Field Effect Transistor). Therefore, the occupation area of one cell is small, and storage elements having a large capacity can be formed in a limited silicon area. It is considered that the FBC can contribute to an increase of the storage capacity.

The principle of writing and reading for an FBC formed on PD-SOI (Partially Depleted-SOI) can be described as follows by taking an N-type MISFET as an example. A state of "1" is defined as a state in which there are a larger number of holes. On the contrary, a state in which the number of holes is smaller is defined as "0".

The FBC includes an nFET formed on, for example, SOI. Its source is connected to GND (0 V) and its drain is connected to a bit line (BL), whereas its gate is connected to a word line (WL). Its body is electrically floating. For writing "1" into the FBC, the transistor is operated in the saturation state. For example, the word line WL is biased to 1.5 V and the bit line BL is biased to 1.5 V. In such a state, a large number of electron-hole pairs are generated near the drain by impact ionization. Among them, electrons are absorbed to the drain terminal. However, holes are stored in the body having a low potential. The body voltage arrives at a balanced state in which a current generating holes by impact ionization balances a forward current of a p-n junction between the body and the source. The body voltage is approximately 0.7 V.

A method of writing data "0" will now be described. For writing "0", the bit line BL is lowered to a negative voltage. For example, the bit line BL is lowered to −1.5 V. As a result of this operation, a p-region in the body and an n-region connected to the bit line BL are greatly forward-biased. Therefore, most of the holes stored in the body are emitted into the n-region. A resultant state in which the number of holes has decreased is the "0" state. As for the data reading, "1" and "0" is distinguished by setting the word line WL to, for example, 1.5 V and the bit line BL to a voltage as low as, for example, 0.2 V, operating the transistor in a linear region, and detecting a current difference by use of an effect (body effect) that a threshold voltage (Vth) of the transistor differs depending upon the number of holes stored in the body.

The reason why the bit line voltage is set to a voltage as low as 0.2 V in this example at the time of reading is as follows: if the bit line voltage is made high and the transistor is biased to the saturation state, then there is a concern that data that should be read as "0" may be regarded as "1" because of impact ionization and "0" may not be detected correctly.

A semiconductor storage device using the FBCs as memory cells (hereafter referred to as FBC memory) is formed by using an SOI substrate. If the film thickness of a buried oxide film is thick, however, it becomes impossible to secure a stabilizing capacitor formed between a body and a support substrate. This results in a problem that the signal quantity of the memory cells cannot be made large.

On the other hand, if the buried insulation film is thin, then a back channel is formed on a side (a region in the vicinity of the buried insulation film) opposite to channel regions of FBCs, NFETs and PFETs formed over the buried insulation film, and device characteristics of the peripheral circuit are degraded.

By the way, circuits that need a fixed reference voltage are included in the peripheral circuit of an FBC memory. Those circuits are, for example, a circuit for adjusting levels of various internal power supply voltages, and an input buffer circuit for determining input logic levels. Each of these reference voltages is required to have a fixed voltage value that is not affected by variations in power supply voltages, temperature variations and variations in characteristics of devices such as transistors.

A band gap reference (BGR) circuit is known as a circuit for generating a stable high-precision reference voltage. In such BGR circuits, pnp bipolar transistors are used in many cases. The pnp transistor is a structure in which a p-substrate is set equal to a ground voltage as its collector and a $p^+$ diffused layer in an n-well is used as its emitter.

This structure forms a vertical bipolar transistor having multiple diffused layers. It is known that a large contact area between the diffused layers can be ensured and the width of the base can be narrowed and consequently a transistor having good characteristics can be implemented.

In forming such a bipolar transistor on a support substrate under the buried oxide film of SOI, however, it becomes difficult to form contacts if the buried oxide film is thick.

SUMMARY OF THE INVENTION

A semiconductor integrated apparatus according to one embodiment of the present invention, comprising: an SOI (Silicon On Insulator) substrate which has support substrate and an embedded insulation film;

an NMOSFET, a PMOSFET and an FBC (Floating Body Cell) formed on the SOI substrate separately from each other;

a first conduction type of first well diffusion region formed along the embedded insulation film in the support substrate below the NMOSFET;

a second conduction type of second well diffusion region formed along the embedded insulation film in the support substrate below the PMOSFET; and a conduction type of third well diffusion region formed along the embedded insulation film in the support substrate below the FBC, wherein the first and second well diffusion regions are set to prescribed potentials, respectively, in order to avoid inversion of conduction type at a side near to the embedded insulation film in a region sandwiched by a channel region of the NMOSFET, a channel region of the PMOSFET and the embedded insulation film.

A semiconductor integrated apparatus according to one embodiment of the present invention, comprising:

an SOI (Silicon On Insulator) substrate which has a support substrate and an embedded insulation film;

a first well diffusion region which contacts a lower surface of the embedded insulation film;

a first and a second diffusion regions having conduction types different from each other, which are formed in the first well diffusion region separate from each other, and which contacts and are formed below the embedded insulation film;

a third diffusion region, which contacts and is formed below the embedded insulation film;

a first contact which extends upward from the first diffusion region by passing through the embedded insulation film;

a second contact which extends upward from the second diffusion region by passing through the embedded insulation film;

a third contact which extends upward from the third diffusion region by passing through the embedded insulation film;

a base electrode connected to the first contact;
an emitter electrode connected to the second contact; and
a collector electrode connected to the third contact.

A semiconductor integrated apparatus according to one embodiment of the present invention, comprising:

an SOI (Silicon On Insulator) substrate which has a support substrate and an embedded insulation film;

a first conduction type of first diffusion region which contacts and is formed below the embedded insulation film;

a second conduction type of second diffusion region which contacts a lower surface of the embedded insulation film, and is formed separately from the first diffusion region;

a first conduction type of third well diffusion region which contacts the lower surface of the embedded insulation film, and is formed deeper than the first and second diffusion regions;

a first conduction type of fourth well diffusion region which contacts the lower surface of the embedded insulation film, and is formed deeper than the first and the second diffusion regions;

a first conduction type of fifth well diffusion region formed in contact with the third and fourth well diffusion regions;

a second conductive type of sixth well diffusion region which covers the first and second diffusion regions, and is positioned in a region separate from the support substrate by the third, fourth and fifth well diffusion regions;

a first contact which extends upward from the first diffusion region by passing through the embedded insulation film;

a second contact which extends upward from the second diffusion region by passing through the embedded insulation film;

a third contact which extends upward from the third well diffusion region by passing through the embedded insulation film;

a fourth contact which extends upward from the fourth well diffusion region by passing through the embedded insulation film;

a cathode electrode connected to the first contact;
an anode electrode connected to the second contact; and a power supply terminal connected to the third and fourth contacts.

DETAILED DESCRIPTION OF THE INVENTION

Hereafter, embodiments of the present invention will be described with reference to the drawings.

First Embodiment

Figure 1:
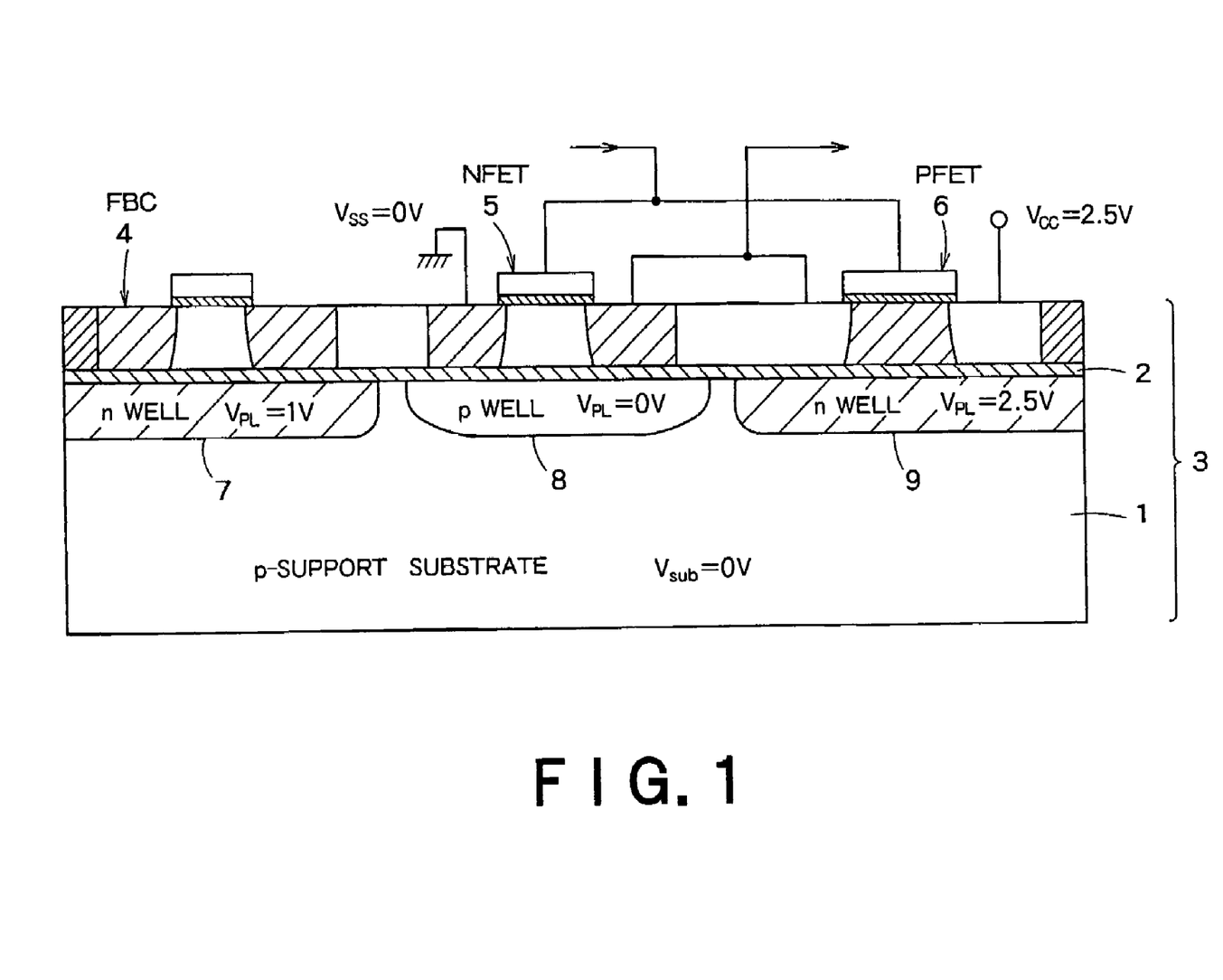
FIG. 1 is a sectional view of a semiconductor integrated device according to a first embodiment of the present invention.

FIG. 1 is a sectional view of a semiconductor integrated device according to a first embodiment of the present invention. In the semiconductor integrated device in FIG. 1, a sectional structure of a peripheral circuit of a semiconductor storage device using FBCs as memory cells is shown.

In the present embodiment, a SOI substrate 3 including a p-support substrate 1 and a buried oxide film 2 formed as a thin film are used. By forming the buried oxide film 2 as a thin film, the signal quantity of the FBCs can be sufficiently ensured and the data retention time can be prolonged.

In FIG. 1, an FBC 4, an NFET 5 and a PFET 6 are formed on a top surface of the buried oxide film 2 in the SOI substrate 3 so as to be separated from each other. An n-well diffused region 7 is formed in contact with the buried oxide film 2, in the p-support substrate 1 located under the FBC 4. A p-well diffused region 8 is formed in the p-support substrate 1 located under the NFET 5. An n-well diffused region 9 is formed in the p-support substrate 1 located under the PFET 6.

The p-support substrate 1 is set to a voltage Vsub=0 V. A voltage VPL=1 V is applied to the n-well diffused region 7.

The p-well diffused region 8 is set to a voltage VPL=0 V. A voltage VPL=2.5 V is applied to the n-well diffused region 9.

The n-well diffused region 7 needs only to be reverse biased as compared with the p-support substrate 1. Therefore, it is not always necessary to set the n-well diffused region 7 equal to 1 V, but a voltage in the range of 0 to 1 V may be applied.

The voltage VPL in the p-well diffused region 8 need not always be 0 V, but it needs only to be 0 V or less. In the same way, the voltage VPL in the n-well diffused region 9 need not always be 2.5 V, but it needs only to be at least Vcc.

By thus applying predetermined voltages respectively to the p-well diffused region 8 and the n-well diffused region 9, a back channel is not formed for the NFET 5 and the PFET 6 and the device characteristics are improved. For example, if the bottom surface side of the buried oxide film 2 under the NFET 5 has a potential higher than 0 V, there is a concern that a back channel may be formed along the buried oxide film 2 under the channel region of the NFET 5. In the present embodiment, however, the p-well diffused region 8 is provided on the bottom surface side of the buried oxide film 2 and the p-well diffused region 8 is set to 0 V or a voltage lower than 0 V. Therefore, the concern that a back channel may be formed for the NFET 5 is eliminated and the device characteristics of the NFET are improved.

In the same way, if the bottom surface side of the buried oxide film 2 under the PFET 6 has a potential lower than 2.5 V, there is a concern that a back channel may be formed along the buried oxide film under the channel region of the PFET 6. In the present embodiment, however, the n-well diffused region 9 is provided on the bottom surface side of the buried oxide film 2 and the n-well diffused region 9 is set to a voltage of at least 2.5 V. Therefore, the concern that a back channel may be formed for the PFET 6 is eliminated and the device characteristics of the PFET are improved.

Figure 2:
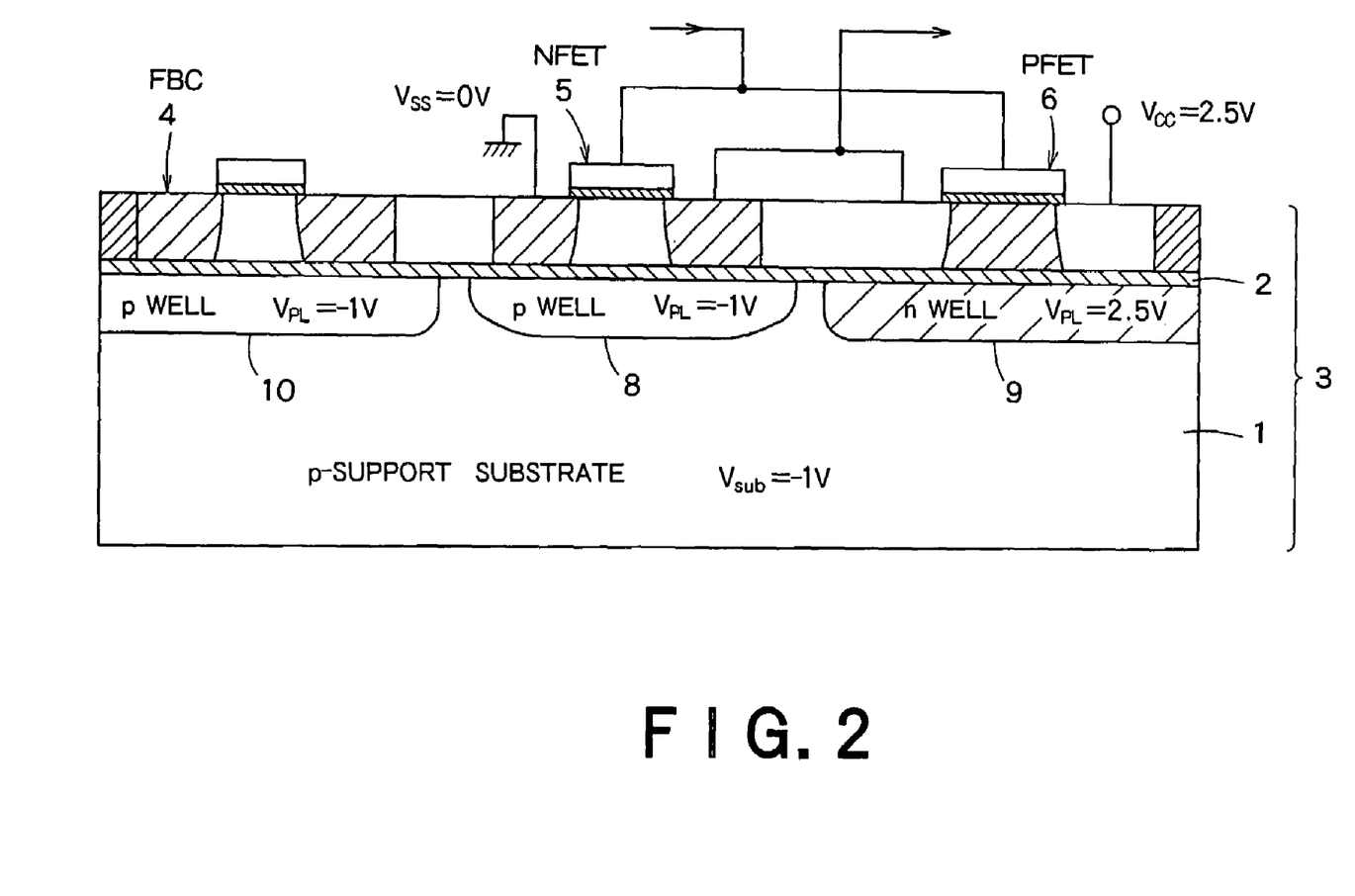
FIG. 2 is a diagram showing a modified example of FIG. 1.

FIG. 2 shows a modified example of FIG. 1. FIG. 2 shows an example in which a voltage VSUB=−1 V is applied to the p-support substrate 1 and the p-well diffused region 10 is formed just under the FBC 4. The same voltage VPL=−1 V as that for the p-support substrate 1 is applied to the p-well diffused region 10. The same voltage VPL=−1 V as that for the p-support substrate 1 is also applied to the p-well diffused region 8 located just under the NFET 5. If the voltage VPL in the p-well diffused region 8 is 0 V or less, a back channel is not formed in the NFET 5. In the case of FIG. 2 as well, occurrence of a back channel can be prevented.

Thus, in the first embodiment, the p-well diffused region 8 and the n-well diffused region 9 are formed on the bottom surface side of the buried oxide film according to the formation places of the NFET 5 and the PFET 6, and predetermined voltages are applied to the well diffused regions, respectively. Therefore, a back channel is not formed in the NFET 5 and the PFET 6, and the device characteristics are improved.

Second Embodiment

Figure 3:
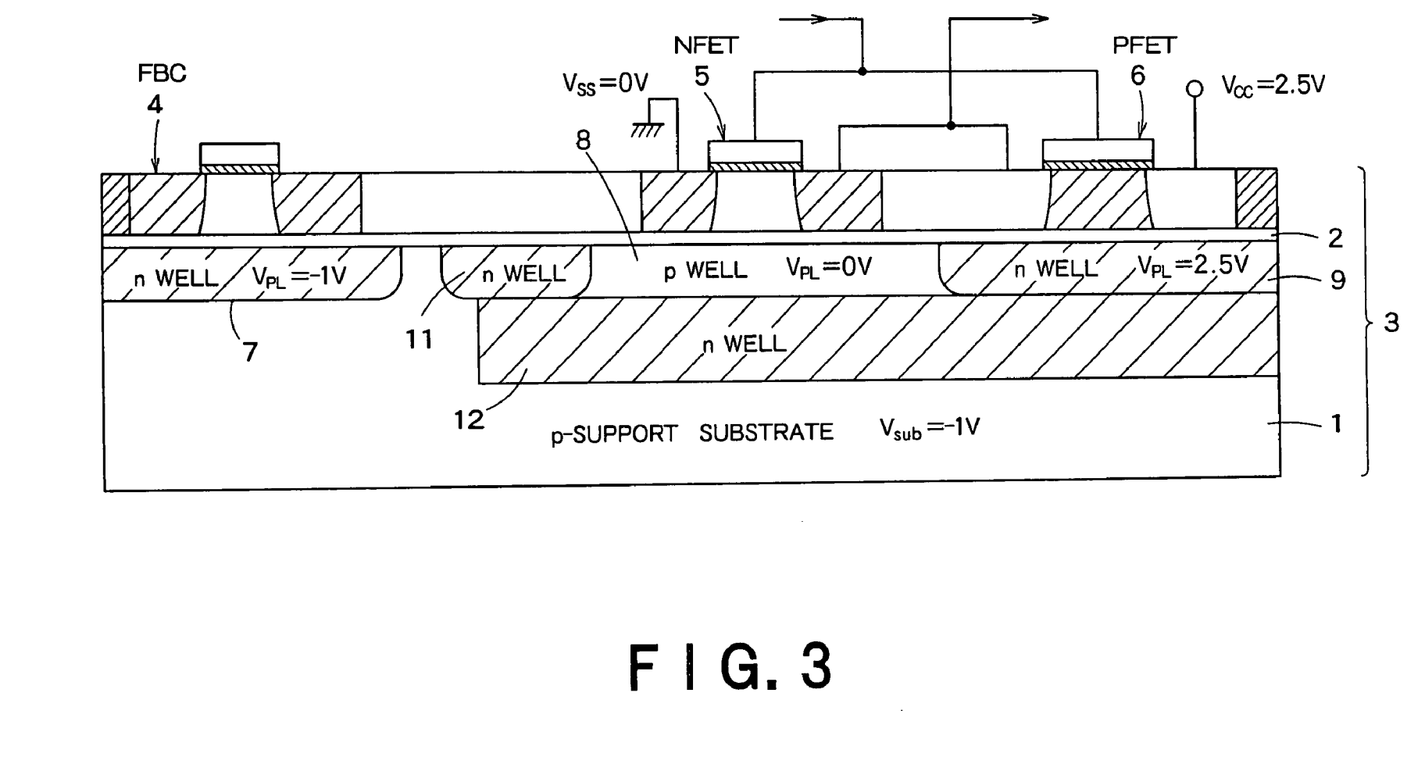
FIG. 3 is a sectional view of a semiconductor integrated device according to a second embodiment of the present invention.

In a second embodiment, a back channel is prevented from being formed when a voltage lower than 0 V is applied to the p-support substrate 1 in the SOI substrate 3.

FIG. 3 is a sectional view of a semiconductor integrated device according to a second embodiment of the present invention. In the same way as FIG. 1, the semiconductor integrated device shown in FIG. 3 includes an FBC 4, an NFET 5 and a PFET 6 formed on a SOI substrate 3 including a p-support substrate 1 and a buried oxide film 2 formed as a thin film, so as to be separated from each other.

In the same way as FIG. 1, an n-well diffused region 7 is formed in the p-support substrate 1 located under the FBC 4. A p-well diffused region 8 is formed in the p-support substrate 1 located under the NFET 5. Furthermore, an n-well diffused region 11 is formed so as to be adjacent to the p-well diffused region 8. An n-well diffused region 12 is formed beneath bottom surfaces of the n-well diffused regions 9 and 11. As a result, the p-well diffused region 8 is separated from the p-support substrate 1.

A voltage VPL=1 V is applied to the n-well diffused region 7. The p-well diffused region 8 is set to a voltage VPL=0 V. A voltage VPL=2.5 V is applied to the n-well diffused region 9. Thus, a voltage different from that for the p-support substrate 1 can be applied to the p-well diffused region 8 by providing the n-well diffused region 12.

As a result, a back channel is formed in neither the NFET 5 nor the PFET 6 in the same way as the first embodiment.

Figure 4:
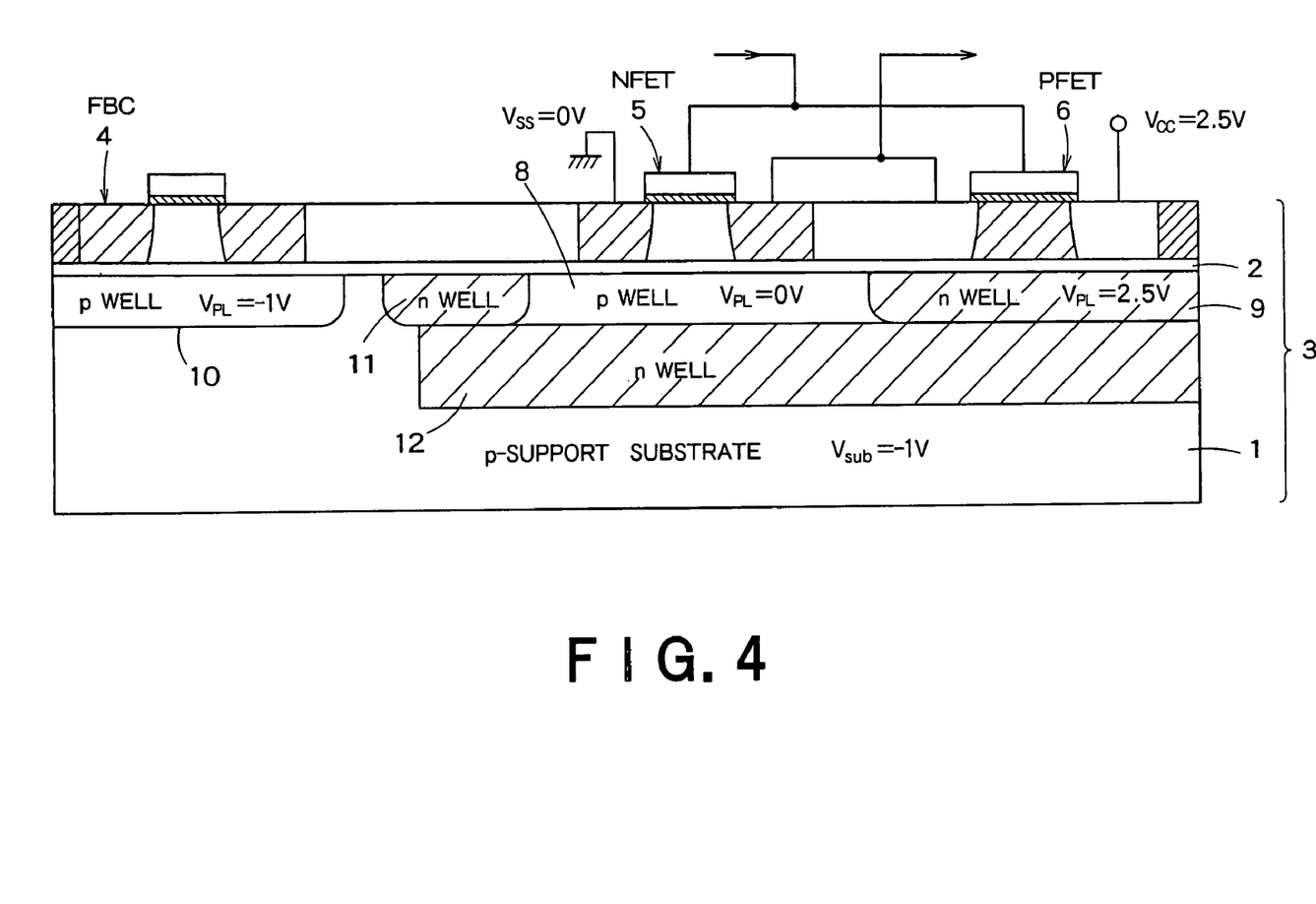
FIG. 4 is a diagram showing a modified example of FIG. 3.

FIG. 4 shows a modified example of FIG. 3. FIG. 4 shows an example in which a p-well diffused region 10 is formed just under the FBC 4 and a voltage VPL=−1 V is applied to this p-well diffused region 10. Except the p-well diffused region 10, FIG. 4 is the same as FIG. 3. In the same way as FIG. 3, the p-well diffused region 8 is separated from the p-support substrate 1 by the n-well diffused region 12.

Thus, in the second embodiment, the p-well diffused region 8 and the n-well diffused region 9 are formed respectively just under the NFET 5 and the PFET 6, and in addition the n-well diffused region 12 is provided under the regions 8 and 9 to separate the p-well diffused region from the p-support substrate 1. Even if a minus voltage is applied to the p-support substrate 1, therefore, a necessary and sufficient voltage can be applied to the p-well diffused region 8 and the n-well diffused region 9 in order to prevent a back channel from being formed in the NFET 5 and the PFET 6.

Third Embodiment

In the first and second embodiments, the SOI substrate 3 including the p-support substrate 1 is used. However, a SOI substrate 3 including an n-support substrate may be used.

Figure 5:
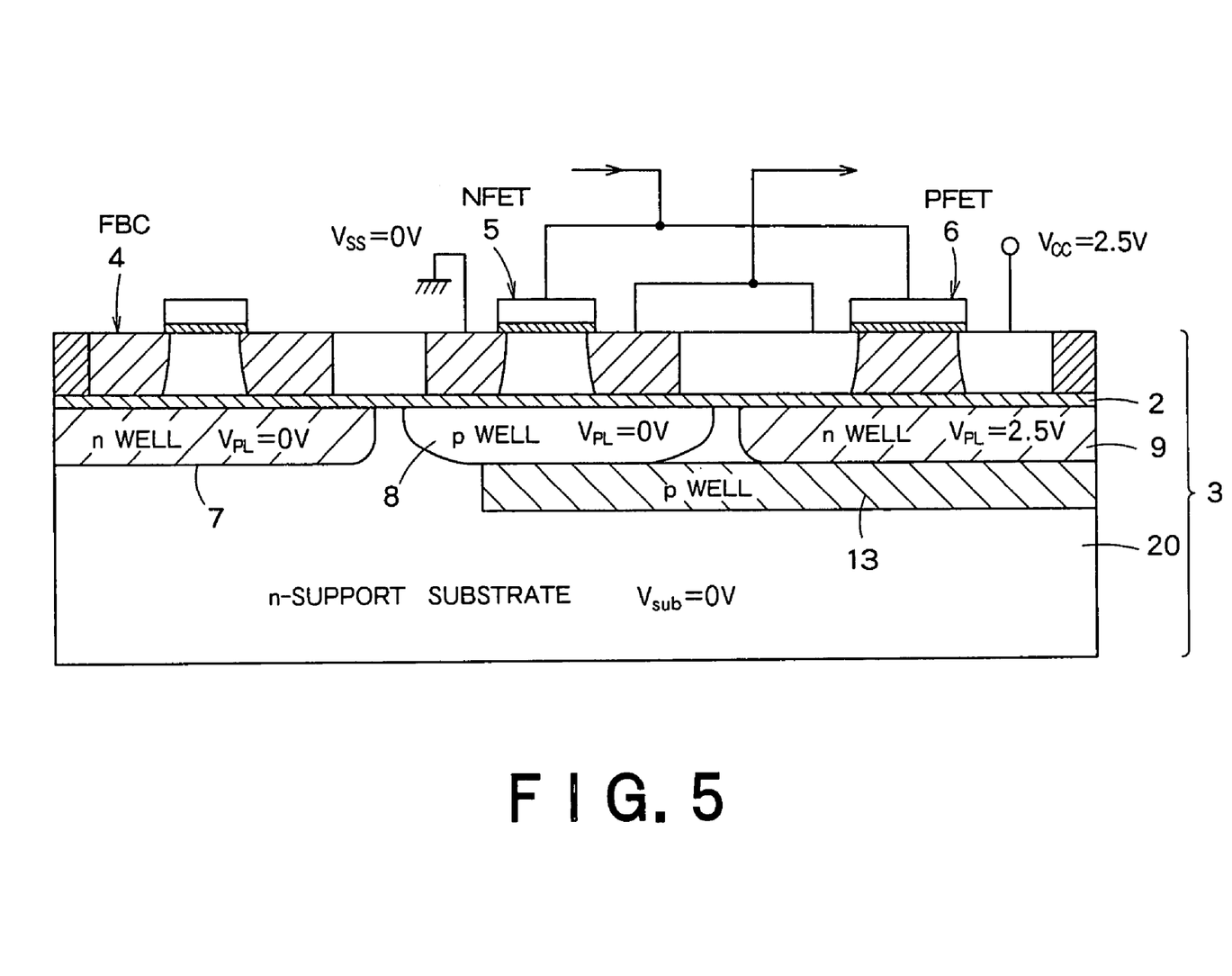
FIG. 5 is a sectional view of a semiconductor integrated apparatus using an SOI substrate having an n support substrate.

In this case, a structure corresponding to FIG. 1 becomes as shown in FIG. 5. A semiconductor integrated device shown in FIG. 5 includes an n-well diffused region formed under an FBC 4, a p-well diffused region 8 formed under an NFET 5, an n-well diffused region 9 formed under a PFET 6, and a p-well diffused region 13 formed on a bottom surface side of the p-well diffused region 8 and the n-well diffused region 9.

An n-support substrate 20 is set to a voltage Vsub=0 V. A voltage VPL=0 V is applied to the n-well diffused region 7. The p-well diffused region 8 is set to a voltage VPL=0 V. A voltage VPL=2.5 V is applied to the n-well diffused region 9. The p-well diffused region 13 is provided to prevent a short-circuit between the n-well diffused region 9 and the n-support substrate 20.

In the semiconductor integrated device shown in FIG. 5 as well, a back channel is formed in neither the NFET 5 nor the PFET 6.

Thus, also in the case of the SOI substrate 3 including the n-support substrate 20, the back channel can be surely prevented from being formed by forming the p-well diffused region 8 and the n-well diffused region 9 are formed respectively under the NFET 5 and the PFET 6 and by applying predetermined voltages respectively to the regions in the same way as the p-support substrate 1.

Fourth Embodiment

In a fourth embodiment, a band gap reference circuit (BGR circuit) is formed by using a SOI substrate 3 including a buried oxide film formed as a thin film.

As described above, a reference potential generation circuit that always generates a fixed reference voltage without being affected by a variation in power supply voltage, a change in temperature and variations in device characteristics is provided in the peripheral circuit for the FBC 4 memory in many cases.

Figure 6:
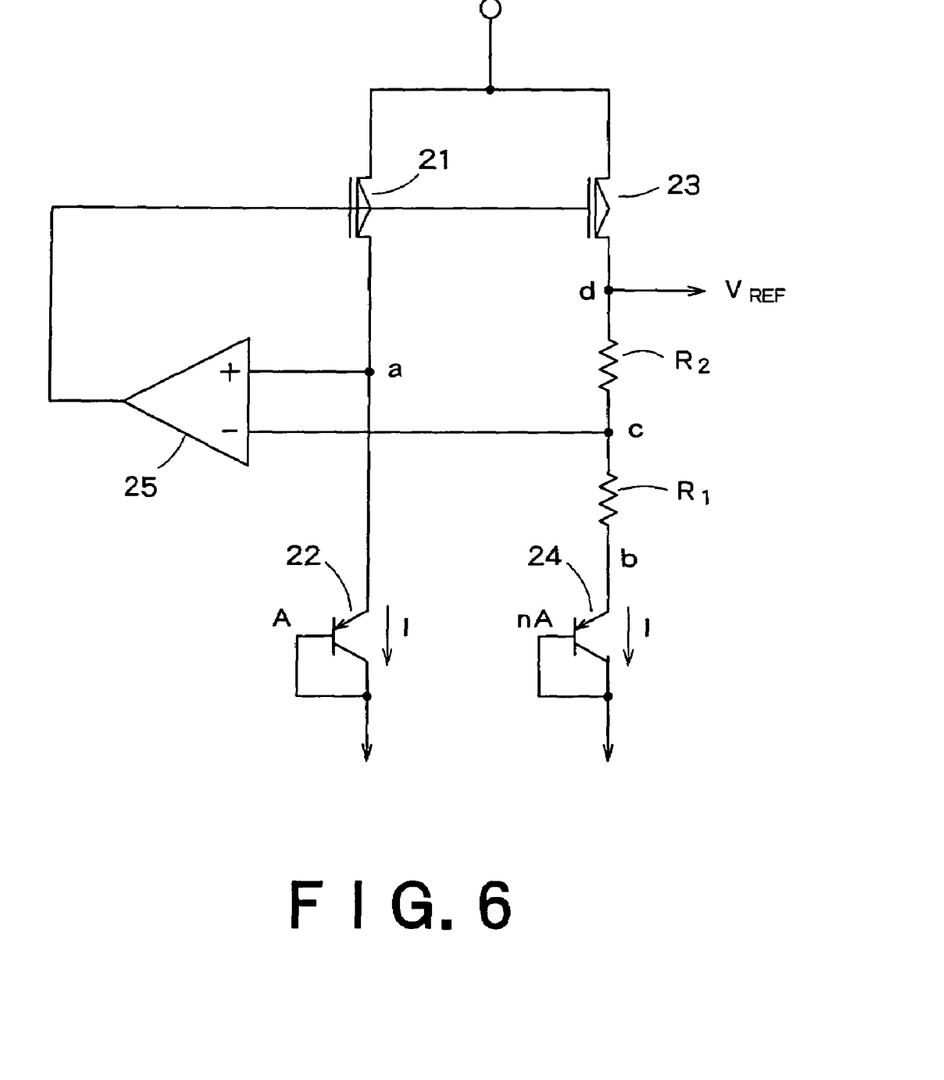
FIG. 6 is a circuit diagram showing an internal configuration of a BGR circuit.

FIG. 6 is a circuit diagram showing an internal configuration of a BGR circuit, which is an example of the reference potential generation circuit. The BGR circuit shown in FIG. 6 includes a PFET 21 and a pnp transistor 22 connected in series between a power supply voltage and a ground voltage, a PFET 23, a resistor R1, a resistor R2 and a pnp transistor 24 connected in series between the power supply voltage and the ground voltage in the same way, and an operational amplifier 25, which supplies a voltage to the gates of PFET 21 and 23 based on a potential difference between a voltage between resistors R1 and R2 and an emitter voltage of the pnp transistor 22. A reference voltage VREF is output from the PFET 23 at its drain.

The transistor 22 is a pnp bipolar transistor having an area of A, whereas the transistor 24 is formed by connecting n pnp bipolar transistors each having the equal area of A in parallel.

Currents flowing respectively through the transistors 22 and 24 are represented by the equations (1) and (2), respectively.

$$I = I_s \times \exp[Va/VT] \quad (1)$$

$$I = n \times I_s \times \exp[Vb/VT] \quad (2)$$

Here, Is is a saturation current of the transistor 22 having the area of A. Va is a drain voltage of the PFET 21. Vb is an emitter voltage of the pnp bipolar transistors. VT is a thermal voltage $kT/q$. Furthermore, k is the Boltzmann constant ($1.38 \times 10^{-23}$ J/K). T is an absolute temperature, and q is the elementary charge ($1.6 \times 10^{-19}$ C.).

The operational amplifier 25 amplifies a potential difference (Va−Vb). The potential difference (Va−Vb) is represented by an equation (3).

$$Va - Vb = VT \times \ln[I/Is] - VT \times \ln[I/(n \times Is)] = VT \times \ln[n] \quad (3)$$

In the circuit shown in FIG. 6, control is exercised by a feedback loop so as to satisfy the relation Va=Vc. Therefore, a equation (4) holds true.

$$Vc - Vb = Va - Vb = VT \times \ln[n] \quad (4)$$

Furthermore, an equation (5) also holds true.

$$Vd - Vb = (1 + R2/R1) \times (Vc - Vb) = (1 + R2/R1) \times VT \times \ln[n] \quad (5)$$

From the equations (4) and (5), an equation (6) is obtained.

$$VREF = VBE + Vd - Vb = VBE + (1 + R2/R1) \times VT \times \ln[n] \quad (6)$$

Here, VBE is a base-emitter voltage of the pnp transistor 24 having the area of n×A. A differential coefficient of the equation (6) with respect to the temperature is represented by an equation (7).

$$\partial VREF/\partial T = -\alpha + (1 + R2/R1) \times \ln[n] \times (k/q) \quad (7)$$

It is now supposed that VBE has a negative differential coefficient of −α, where α=1.5 mV/K (@ room temperature). For eliminating the dependence of VREF upon temperature at the room temperature, therefore, it is necessary that an equation (8) is satisfied.

$$(1 + R2/R1) \times \ln[n] = \alpha \times (q/k) = 17.4 \quad (8)$$

From the equation (8), it is appreciated that the dependence of VREF upon temperature at the room temperature can be eliminated by setting, for example, so as to satisfy the relations R2/R1=4 and n=32.5.

Thus, by suitably selecting the ratio between the resistors R1 and R2 and the ratio between the transistors 22 and 24, a stable reference voltage that does not depend upon the temperature and the power supply voltage is obtained. Even if the process varies, this stabilization condition depends on only ratios between device parameters and consequently a fixed reference voltage is obtained.

Figure 7:
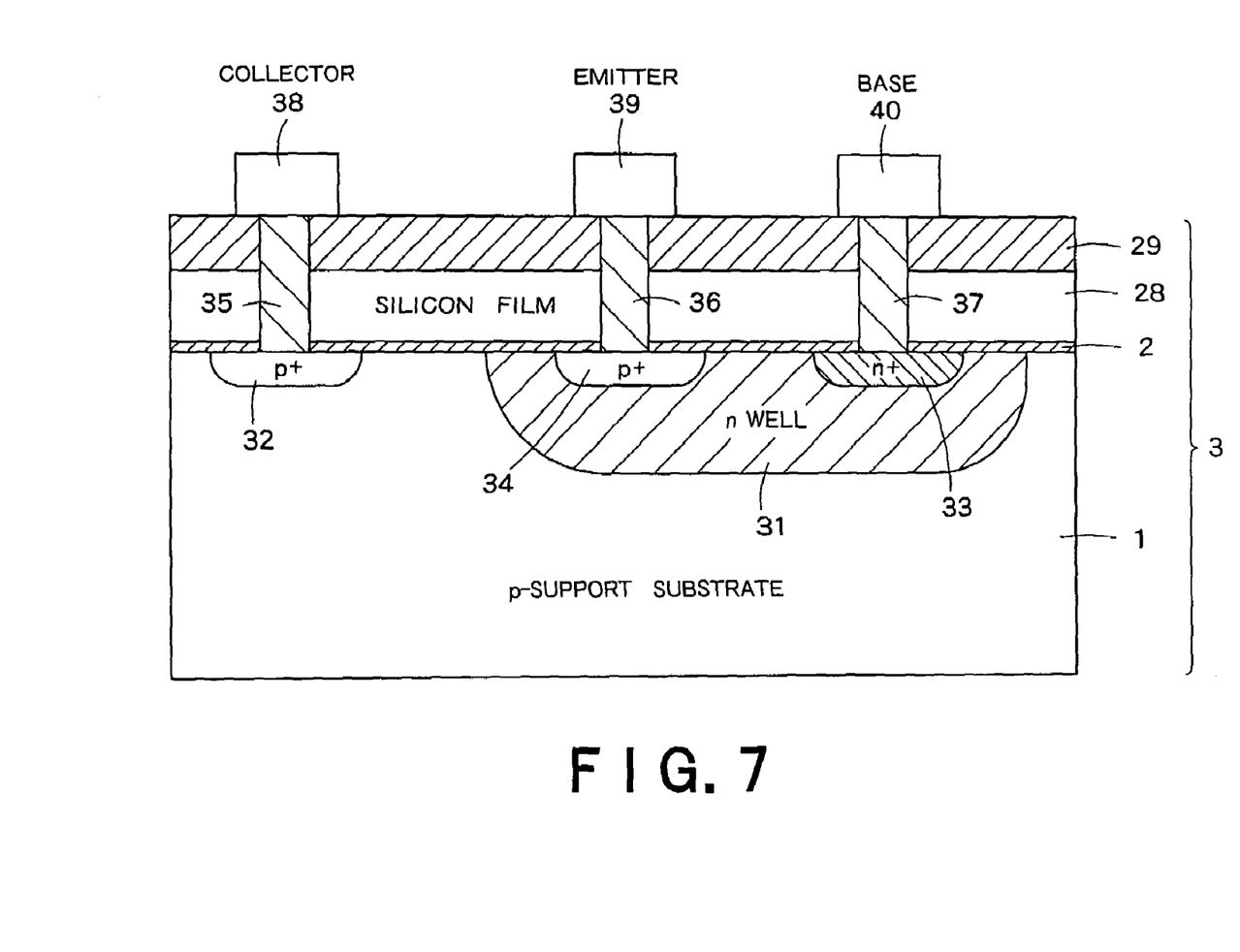
FIG. 7 is a diagram showing a sectional structure of the pnp bipolar transistors 22 and 24.

FIG. 7 is a diagram showing a sectional structure of the pnp bipolar transistors 22 and 24. The transistor shown in FIG. 7 is formed by using the SOI substrate 3 including the buried oxide film 2 formed as a thin film. On the top surface of the buried oxide film 2, a silicon film 28 and an insulation film 29 are successively formed.

An n-well diffused region 31 and a p$^+$ diffused region 32 for the collector are formed in the p-support substrate 1 along a bottom surface of the buried oxide film 2. Within the n-well diffused region 31, an n$^+$ diffused region 33 for the base and a p$^+$ diffused region 34 for the emitter are further formed along the buried oxide film 2.

Contacts 35, 36 and 37 passing through the buried oxide film 2 are formed in the p$^+$ diffused region 32, the n$^+$ diffused region 33 and the p$^+$ diffused region 34, respectively. A collector electrode 38, a base electrode 39 and an emitter electrode 40 are formed in the contacts 35, 36 and 37, respectively.

In the pnp bipolar transistor shown in FIG. 7, the buried oxide film 2 is formed as a thin film. Therefore, the contacts can be formed easily upward from the well diffused regions.

The pnp bipolar transistor shown in FIG. 7 can be formed on the SOI substrate 3 in the same way as the FBC 4 and its peripheral circuit shown in FIG. 1. As a result, a reference voltage generating circuit used by the FBC 4 and its peripheral circuit can be formed easily on the same substrate.

In the case where a minus voltage is applied to the support substrate as shown in FIG. 3, however, a pnp bipolar transistor cannot be formed. The reason is that the collector of the pnp bipolar transistor cannot be made equal to the ground potential if the support substrate has a minus potential. In such a case, therefore, a diode can be used instead of the pnp bipolar transistor.

Figure 8:
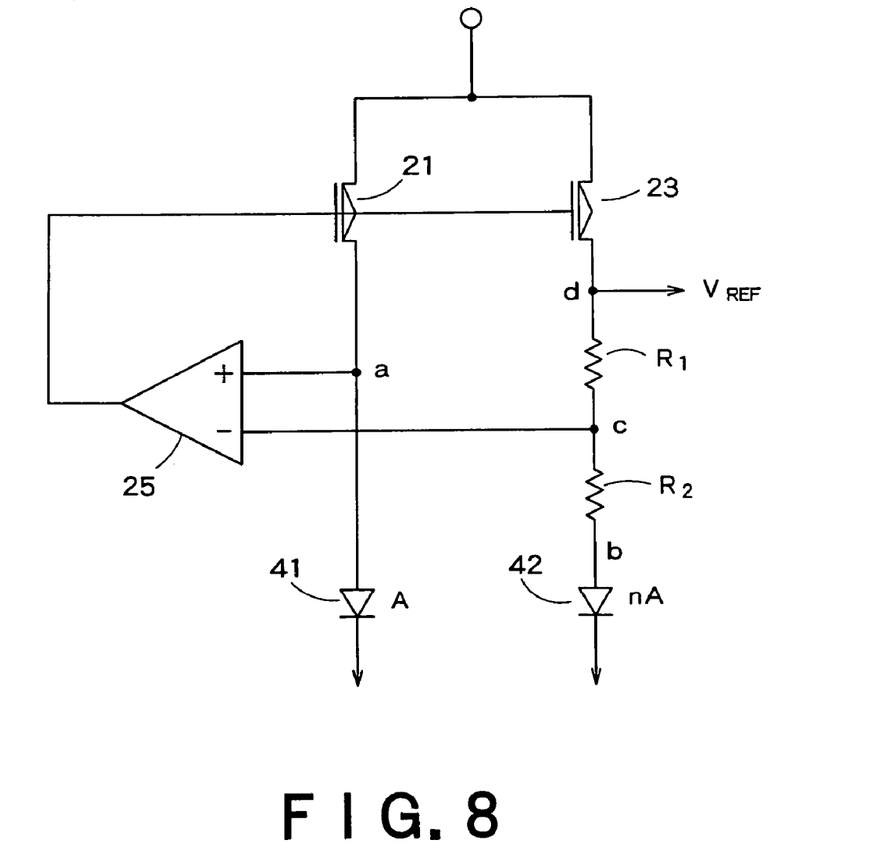
FIG 8 is a circuit diagram showing an example of a BGR circuit including a diode instead of the pnp bipolar transistor. In the BGR circuit shown in FIG. 8.

FIG. 8 is a circuit diagram showing an example of a BGR circuit including a diode instead of the pnp bipolar transistor. In the BGR circuit shown in FIG. 8, the pnp bipolar transistors 22 and 24 shown in FIG. 6 are replaced by diodes 41 and 42. The diode 41 is connected at its anode to the PFET 21 at its drain, and the diode 41 is connected at its cathode to the ground. The diode 42 is connected at its anode to the resistor R1, and the diode 42 is connected at its cathode to the ground.

Figure 9:
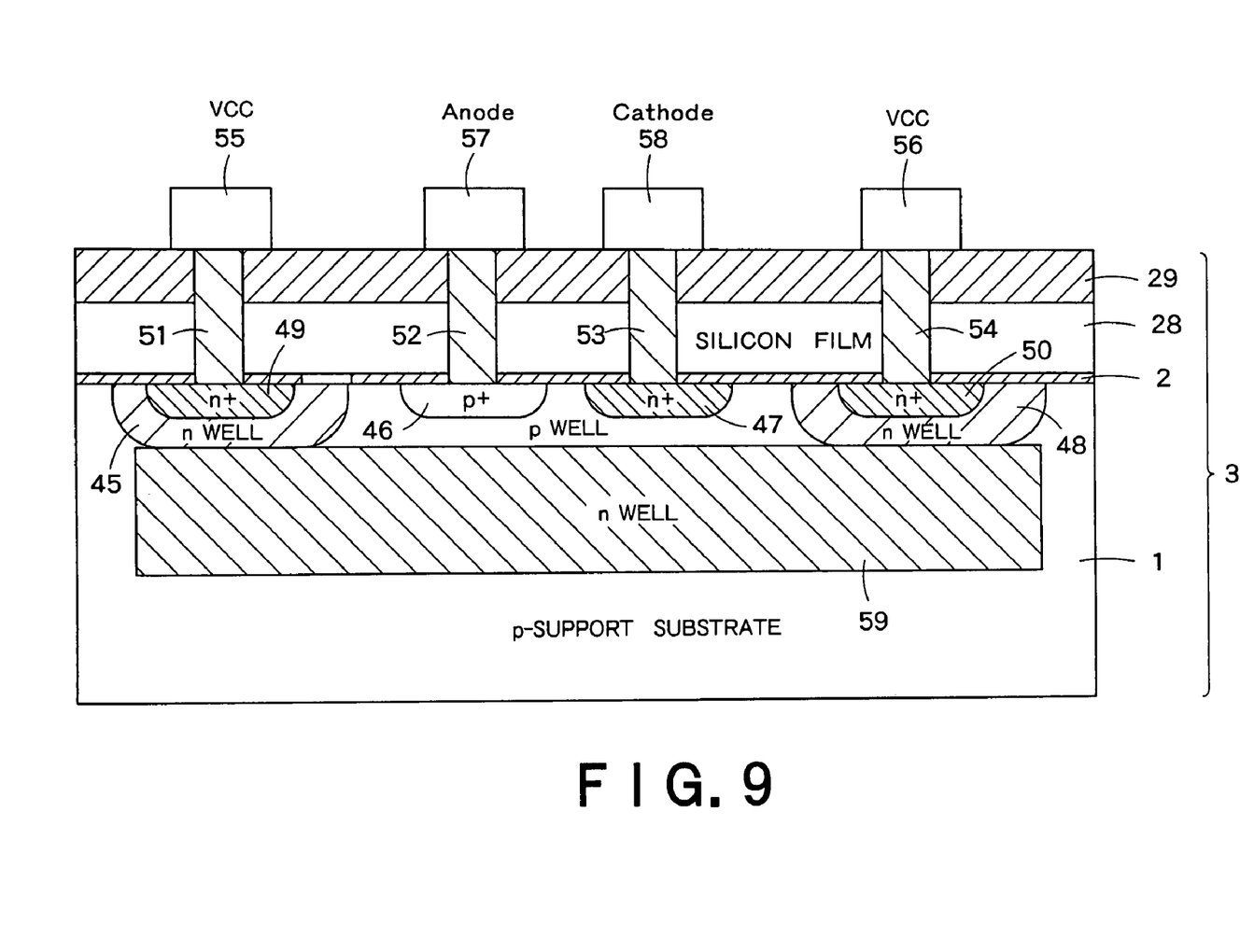
FIG. 9 is a sectional view showing an example of a sectional structure in the case where the diodes are formed on the SOI substrate 3.

FIG. 9 is a sectional view showing an example of a sectional structure in the case where the diodes are formed on the SOI substrate 3. In the p-support substrate 1 on the bottom surface side of the buried oxide film 2, an n-well diffused region 45 for power supply, a p$^+$ diffused region 46 for anode, an n$^+$ diffused region 47 for cathode, and an n-well diffused region 48 for power supply are formed. In the n-well diffused regions 45 and 48, n$^+$ diffused regions 49 and 50 are formed, respectively.

Contacts 51, 52, 53 and 54 passing through the buried oxide film 2 are formed in the n$^+$ diffused region 49, the p$^+$ diffused region 46, the n$^+$ diffused region 47 and the n$^+$ diffused region 50, respectively. The contacts 51 and 54 are connected to power supply terminals 55 and 56, respectively. The contact 52 is connected to an anode electrode 57, and the contact 53 is connected to a cathode electrode 58.

The n-well diffused regions 45 and 48 are formed so as to be deeper than the p+ diffused region 46 and the n+ diffused region 47. An n-well diffused region 59 is formed beneath the bottom surface of the n-well diffused regions 45 and 48. The p+ diffused region 46 is separated from the p-support substrate 1 by the n-well diffused region 59.

The diodes having the structure shown in FIG. 9 can set the p-support substrate 1 to a minus potential. Therefore, the diodes can be formed on the same substrate as that of the semiconductor integrated device having the structure shown in FIG. 3.

Thus, in the fourth embodiment, the bipolar transistors and the diodes are formed by using the SOI substrate 3 including the buried oxide film formed as a thin film. Therefore, the reference voltage generating circuit for generating the reference voltage needed by the FBC 4 memory and its peripheral circuit can be formed easily on the same substrate.

Other Embodiments

Figure 10:
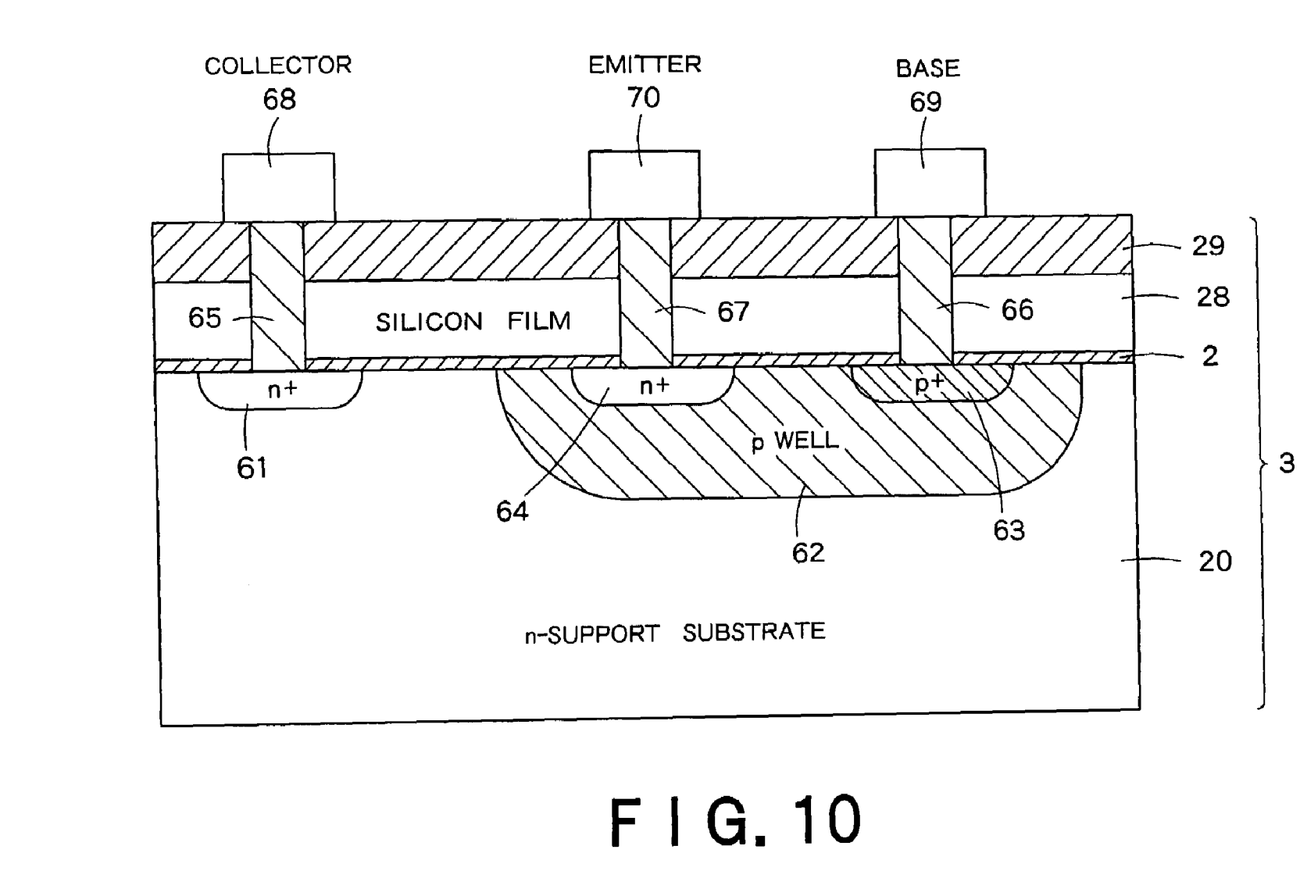
FIG. 10 is a sectional view showing a sectional structure in the case where an npn bipolar transistor is formed by using the SOI substrate 3 including an n-support substrate 20.

The example in which a pnp bipolar transistor is formed has been described with reference to FIG. 7. However, it is also possible to form an npn bipolar transistor. FIG. 10 is a sectional view showing a sectional structure in the case where an npn bipolar transistor is formed by using the SOI substrate 3 including an n-support substrate 20.

The npn bipolar transistor shown in FIG. 10 includes an n+ diffused region 61 and a p-well diffused region 62 formed on the bottom surface side of the buried oxide film 2. Within the p-well diffused region 62, a p+ diffused region 63 for base and an n+ diffused region 64 for emitter are formed. In the same way as FIG. 7, contacts 65, 66 and 67 passing through the buried oxide film 2 are formed respectively in the n+ diffused region 61, the p+ diffused region 63 and the n+ diffused region 64. The contacts 65, 66 and 67 are connected to a collector electrode 68, a base electrode 69 and an emitter electrode 70, respectively.

The npn bipolar transistor shown in FIG. 10 can be formed on the same substrate as that for the semiconductor integrated device shown in, for example, FIG. 5.

By forming the contacts passing through the buried oxide film 2 and forming electrodes on the top surface side of the contacts, voltages can be applied to the well diffused regions of the above-described FBC 4, the peripheral circuit of the FBC 4, and the bipolar transistors and diodes.

Figure 11:
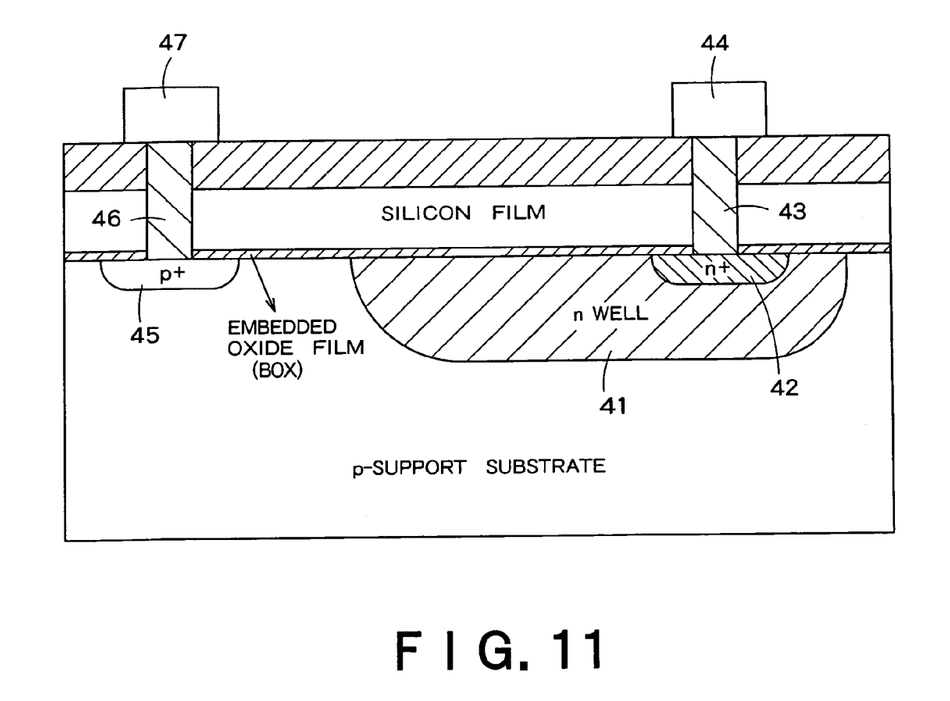
FIG. 11 is a diagram showing a voltage application method that can be applied in common to all well-diffused regions of the above-described circuits.

FIG. 11 is a diagram showing a voltage application method that can be applied in common to all well-diffused regions of the above-described circuits. As shown in FIG. 11, an n-well diffused region 41 is formed in the p-support substrate 1 so as to be in contact with the buried oxide film 2. In the case where an n+ diffused region 42 is formed within the n-well diffused region 41, a contact 43 passing through the buried oxide film 2 upward from the n+ diffused region 42 should be formed. This contact is connected to an electrode 44. In the same way, a contact 46 passing through the buried oxide film 2 should also be formed over a p+ diffused region 45 in the p-support substrate 1, and the contact 46 may be connected to an electrode 47.

What is claimed is:

1. A semiconductor integrated apparatus, comprising:
    an SOI (Silicon On Insulator) substrate which has a p type of support substrate and an embedded insulation film;
    an NMOSFET, a PMOSFET and an FBC (Floating Body Cell) formed on the SOI substrate separately from each other;
    a p type of first well diffusion region formed along the embedded insulation film in the support substrate below the NMOSFET;
    an n type of second well diffusion region formed along the embedded insulation film in the support substrate below the PMOSFET; and
    a p type of third well diffusion region formed along the embedded insulation film in the support substrate below the FBC.

2. The semiconductor integrated apparatus according to claim 1, wherein the first and second well diffusion regions are set to prescribed potentials, respectively, in order to avoid inversion of the SOI at a side near to the embedded insulation film in a region sandwiched by a channel region of the NMOSFET, a channel region of the PMOSFET and the embedded insulation film.

3. The semiconductor integrated apparatus according to claim 1, further comprising:
    a conduction type of fourth well diffusion region formed in contact with lower surfaces of the first and second well diffusion regions.

4. The semiconductor integrated apparatus according to claim 3, further comprising:
    an n type of fifth well diffusion region which is formed adjacent to the first well diffusion region, and formed along the embedded insulation film in contact with the fourth well diffusion region.

5. A semiconductor integrated apparatus, comprising:
    an SOI (Silicon On Insulator) substrate which has a support substrate and an embedded insulation film;
    an NMOSFET, a PMOSFET and an FBC (Floating Body Cell) formed on the SOI substrate separately from each other;
    a p type of first well diffusion region formed along the embedded insulation film in the support substrate below the NMOSFET;
    an n type of second well diffusion region formed along the embedded insulation film in the support substrate below the PMOSFET; and
    a conduction type of third well diffusion region formed along the embedded insulation film in the support substrate below the FBC;
    a first contact which extends upward from the first well diffusion region by passing through the embedded insulation film;
    a second contact which extends upward from the second well diffusion region by passing through the embedded insulation film; and
    a third contact which extends upward from the third well diffusion region by passing through the embedded insulation film,
    wherein prescribed voltages are applied to the first to third well diffusion regions via the first to third contacts, respectively.

6. The semiconductor integrated apparatus according to claim 1, wherein the first well diffusion region is set to a voltage equal to or less than a source voltage of the NMOSFET; and
    the second well diffusion region is set to a voltage equal to or more than a source voltage of the PMOSFET.

7. The semiconductor integrated apparatus according to claim 6, wherein a source of the NMOSFET is 0V; and
    the first well diffusion region and the support substrate are set to 0V.

8. The semiconductor integrated apparatus according to claim 6, wherein a source of the NMOSFET is 0V; and
    the first well diffusion region and the support substrate are set to a negative potential.

9. A semiconductor integrated apparatus, comprising:
an SOI (Silicon On Insulator) substrate which has a conduction type of support substrate, a silicon layer and an embedded insulation film sandwiched between the support substrate and the silicon layer;
a first well diffusion region which contacts a lower surface of the embedded insulation film;
a first and a second diffusion regions having conduction types different from each other, which are formed in the first well diffusion region separate from each other, and which contacts and are formed below the embedded insulation film;
a third diffusion region, which contacts and is formed below the embedded insulation film;
a first contact which extends upward from the first diffusion region by passing through the embedded insulation film;
a second contact which extends upward from the second diffusion region by passing through the embedded insulation film;
a third contact which extends upward from the third diffusion region by passing through the embedded insulation film;
a base electrode connected to the first contact;
an emitter electrode connected to the second contact; and
a collector electrode connected to the third contact.

10. The semiconductor integrated apparatus according to claim 9, wherein the support substrate, the second diffusion region and the third diffusion region are a first conduction type; and
the first well diffusion region and the first diffusion region are a second conduction type.

11. The semiconductor integrated apparatus according to claim 9, further comprising:
a reference voltage generating circuit which outputs a reference voltage, the reference voltage generating circuit including:
a first and a second transistors connected in series between first and second supply voltage terminals;
a third transistor, a first impedance element, a second impedance element and a fourth transistor connected in series between the first and second supply voltage terminals; and
a differential amplifier which supplies a signal in accordance with a potential difference between a voltage of a connection node between the first and second transistors and a voltage of a connection node between the first impedance element and the second impedance element, to gates of the first and third transistors,
the reference voltage generating circuit outputting the reference voltage from a connection node between the third transistor and the first impedance element,
each of the second transistor and the fourth transistor being a bipolar transistor which has a base and a collector short-circuited to each other and operates as a current source, and
each of the second transistor and the fourth transistor having the first well diffusion region, the first diffusion region, the second diffusion region, the third diffusion region, the first contact, the second contact and the third contact.

12. A semiconductor integrated apparatus, comprising:
an SOI (Silicon On Insulator) substrate which has a support substrate and an embedded insulation film;
a first conduction type of first diffusion region which contacts and is formed below the embedded insulation film;
a second conduction type of second diffusion region which contacts a lower surface of the embedded insulation film, and is formed separately from the first diffusion region;
a first conduction type of third well diffusion region which contacts the lower surface of the embedded insulation film, and is formed deeper than the first and second diffusion regions;
a first conduction type of fourth well diffusion region which contacts the lower surface of the embedded insulation film, and is formed deeper than the first and the second diffusion regions;
a first conduction type of fifth well diffusion region formed in contact with the third and fourth well diffusion regions;
a second conduction type of sixth well diffusion region which covers the first and second diffusion regions, and is positioned in a region separate from the support substrate by the third, fourth and fifth well diffusion regions;
a first contact which extends upward from the first diffusion region by passing through the embedded insulation film;
a second contact which extends upward from the second diffusion region by passing through the embedded insulation film;
a third contact which extends upward from the third well diffusion region by passing through the embedded insulation film;
a fourth contact which extends upward from the fourth well diffusion region by passing through the embedded insulation film;
a cathode electrode connected to the first contact;
an anode electrode connected to the second contact; and
a power supply terminal connected to the third and fourth contacts.

13. The semiconductor integrated apparatus according to claim 12, wherein the first conduction type is n-type; and
the second conduction type is p-type.

14. The semiconductor integrated apparatus according to claim 12, further comprising:
a reference voltage generating circuit which outputs a reference voltage, the reference voltage generating circuit including:
a first transistor and a first diode connected directly between first and second supply voltage terminals;
a second transistor, a first impedance element, a second impedance element and a second diode connected in series between the first and second supply voltage terminals; and
a differential amplifier which supplies a signal in accordance with a potential difference between a voltage of a connection node between the first transistor and the first diode and a voltage of a connection node between the first impedance element and the second impedance element, to gates of the first and second transistors,
the reference voltage generating circuit outputting the reference voltage from a connection node between the second transistor and the first impedance element,
each of the first and second diodes having a the first diffusion region, the second diffusion region, the third well diffusion region, the fourth well diffusion region, the fifth well diffusion region, the sixth well diffusion region, the first contact, the second contact, the third contact and the fourth contact.

* * * * *